United States Patent
Kudlugi et al.

(10) Patent No.: US 6,817,001 B1
(45) Date of Patent: Nov. 9, 2004

(54) FUNCTIONAL VERIFICATION OF LOGIC AND MEMORY CIRCUITS WITH MULTIPLE ASYNCHRONOUS DOMAINS

(76) Inventors: Muralidhar R. Kudlugi, 2 John McQuinn Cir., Framingham, MA (US) 01701; Charles W. Selvidge, 24 Hillside Rd., Wellesley, MA (US) 02181

( * ) Notice: Subject to any disclaimer, the term of this patent is extended or adjusted under 35 U.S.C. 154(b) by 113 days.

(21) Appl. No.: 10/103,617
(22) Filed: Mar. 20, 2002
(51) Int. Cl.[7] .................................................. G06F 17/50
(52) U.S. Cl. ........................... 716/6; 716/4; 716/12; 716/16
(58) Field of Search ............................... 716/6, 4, 12, 16

(56) References Cited

U.S. PATENT DOCUMENTS

| | | | |
|---|---|---|---|
| 5,608,645 A | * | 3/1997 | Spyrou .......................... 716/6 |
| 5,659,716 A | | 8/1997 | Selvidge et al. |
| 6,009,531 A | | 12/1999 | Selvidge et al. |
| 6,473,726 B1 | | 10/2002 | Reblewski |

FOREIGN PATENT DOCUMENTS

WO    WO 94/06210    3/1994

OTHER PUBLICATIONS

Jack S.N. Jean, et al., "Dynamic Reconfiguration to Support Concurrent Applications", IEEE Transactions on Computers, vol. 48, No. 6, Jun. 1999, pp. 591–602.

Charles Selvidge, et al., "Tiers: Topology IndependEnt Pipelined Routing and Scheduling for VirtualWire™Compilation".

* cited by examiner

*Primary Examiner*—Vuthe Siek
*Assistant Examiner*—Brandon Bowers
(74) *Attorney, Agent, or Firm*—Banner & Witcoff, Ltd.

(57) ABSTRACT

In an emulation system, a method is provided to schedule evaluations of state elements and memory elements receiving signals from multiple asynchronous clock domains, such that causality and hold time requirements are satisfied. In addition, a method is provided such that logic signals responsive to multiple asynchronous clock domains are transported along separate single domain path of substantially equal transit times. In one implementation, the scheduling method computes departure times and ready times for output and input terminals of logic modules, such as FPGAs.

22 Claims, 11 Drawing Sheets

FIG. 7
| Nets | Depth | MtsdDepth |
|------|-------|-----------|
| W9 | 1 | 1 |
| W6 | 2 | 2 |
| W8 | 4 | 4 |
| W7 | 5 | 5 |
| W5 (D1) | 3 | 6 |
| W5 (D2) | 6 | 6 |
| W4 | 7 | 7 |
| W3 | 4 | 7 |
| W1 | 8 | 8 |
| W0 | 5 | 8 |
FIG. 8
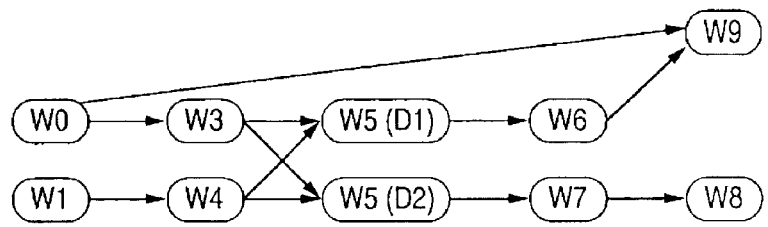
FIG. 9
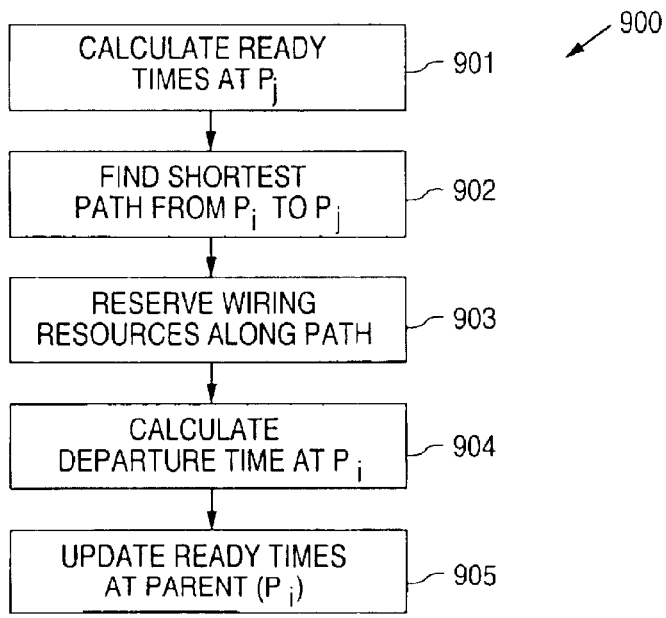
901 — CALCULATE READY TIMES AT $P_j$
902 — FIND SHORTEST PATH FROM $P_i$ TO $P_j$
903 — RESERVE WIRING RESOURCES ALONG PATH
904 — CALCULATE DEPARTURE TIME AT $P_i$
905 — UPDATE READY TIMES AT PARENT ($P_i$)

FUNCTIONAL VERIFICATION OF LOGIC AND MEMORY CIRCUITS WITH MULTIPLE ASYNCHRONOUS DOMAINS

FIELD OF THE INVENTION

The present invention relates to emulation of logic and memory circuits; in particular, the present invention relates to emulation of logic and memory circuits having timing signals of multiple asynchronous domains.

DISCUSSION OF THE RELATED ART

In logic circuit design, a logic emulation system is often used to verify the correct functional operation of a user design. One example of a logic emulation system is the field programmable gate array (FPGAs) based emulation system described in U.S. Pat. No. 5,596,742, entitled "Virtual Interconnections for Reconfigurable Systems," issued on Jan. 21, 1997 ("Virtual Interconnection Patent"). The Virtual Interconnection Patent is hereby incorporated by reference in its entirety to provide background of the art.

FIG. 1 illustrates exemplary emulation system 100 for logic verification in an in-circuit emulation configuration. As shown in FIG. 1, emulation system 100 includes emulation hardware 5, which consists of FPGAs 12 connected (as indicated by element 14) in a predetermined topology (e.g., 2-dimensional mesh) and memory system 6, host computer 2 and target system 4. Software in host computer 2 partitions a user circuit into individual partitions, each partition to be configured into an FPGA for emulation. Typically, during emulation, a control program running in host computer 2 controls the emulation of the user circuit in emulation hardware 5. In one form of emulation, known as "in-circuit emulation," target system 4 provides input stimuli to, and receives output signals from emulation hardware 5. Often, target system 4 provides one or more clock signals ("user clock signals") to operate the user circuit implemented in emulation hardware 5. In the system described in the Virtual Interconnection Patent, logic is evaluated and the results are communicated in emulation hardware 5 using a high-speed system clock signal ("virtual clock"). In that system, multiple signals are pin-multiplexed and pipelined between FPGAs.

In one emulation system, to ensure causality in the user circuit is reflected in the circuit configured into emulation hardware 5, and to avoid timing problems (e.g., violation of a "hold time" requirement), signal transmission among FPGAs are scheduled in space and time. Such a scheduling scheme is described, for example, in the paper "TIERS: Topology IndependEnt Pipelined Routing and Scheduling for VirtualWire™ Compilation," by Charles Selvidge et al., published in the ACM/SIGDA International Symposium on Field Programmable Gate Arrays, pp. 25–31, 1995. A system implementing the TIERS scheduling scheme is disclosed in U.S. Pat. No. 5,659,716, entitled "Pipe-lined Static Router and Scheduler for Configurable Logic System Performing Simultaneous Communications and Computation," issued on Aug. 19, 1997 ("TIERS Scheduling Patent"). The TIERS Scheduling Patent is hereby incorporated by reference in its entirety to provide background of the art.

In the prior art, to schedule logic evaluation and the result communication among FPGAs, user clock signals are provided fixed timing relationships relative to the system clock signal, so that the user design is effectively mapped into a synchronous single clock domain. However, in modern integrated circuits, a data signal often transitions and is sampled at clock edges of multiple asynchronous clock domains. In the past, such a data signal (known as a "multiple transition and sample domain" or "MTSD" signal) could be modeled accurately with respect to only one of those constituent domains. Further, to properly operate the emulation hardware, manual and special compilation steps that isolate individual asynchronous domains in the user design are required. However, this approach is not only difficult and time-consuming, the results are often unpredictable and error-prone.

SUMMARY OF THE INVENTION

The present invention provides methods in an emulation system to correctly model and verify user circuits having logic signals ("MTSD signals") that can transition or that are sampled in response to timing signals in more than one clock domain. The present invention can be applied to in-circuit emulation, targetless emulation, static target emulation (where the emulation provides one or more clock to the target system), co-modeling (where the model running in an emulator hardware interacts with software in the host processor), or a combination of some of the above techniques.

According to one aspect of the present invention, a method correctly transports values of an MTSD signal between a source logic module and a destination logic module by: (1) dividing the MTSD signal into related single domain signals; (2) assigning the related single domain signals to be routed through separate paths between the source and destination logic modules; and (3) causally merging the related single domain signals at the destination logic module. These logic modules can be, for example, field programmable logic arrays (FPGAs) or other programmable logic devices typically used in an emulation system. In one embodiment, the method inserts delay elements in selected paths, so that transit times in the single paths are substantially equal. In one implementation, at the destination logic module, the causal merging procedure selects as the MTSD signal value tile most recently arrived value among the values on the paths. Using these techniques, correct logic operation is ensured regardless of path delays between logic modules.

In one embodiment of the present invention, a target distance is computed. That target distance has at least the length of the longest one of separate paths. For a single domain signal between an output terminal of a source logic module and an input terminal of a destination logic module, the method ensures satisfaction of a required arrival time requirement of the single domain signal at the input terminal. The method then attempts to schedule paths of lengths less than or equal to the target distance. To facilitate scheduling of the paths, the dependency of signals between an output terminal and the input terminals that feed signal to the output terminal is traced through logic circuits within the logic module. (This method exemplifies a backward scheduling implementation; the present invention can be implemented using forward scheduling upon consideration of the principles of the present invention explained in the detail description.) The dependency relationship can be represented by a same domain depth and a multi-domain depth. To ensure proper scheduling of signals, delay elements can be inserted in the source logic module, the destination logic module, or both. The related single domain signals are dependently scheduled (e.g., scheduled together or simultaneously).

In accordance with another aspect of the present invention, a method is provided to schedule MTSD data and control signals to ensure same-domain and cross-domain timing constraints (e.g., setup and hold times) are satisfied. The problem solved involves scheduling signal arrival at a first set of input terminals of a logic module, which combinationally reach one or more data terminals of a state element, relative to a second set of input terminals of that logic module which combinationally reach one or more timing input terminals of the state element. Further, the method provides for the timing of output terminals of the logic module combinationally reached from an output terminal of the state element.

In one embodiment, a method according to the present invention includes (1) computing a minimum delay value between each of the first set of input terminals and a state element; (2) computing a maximum delay value between the second set of input terminals and the state element; (3) assigning an evaluation time for the state element; (4) assigning a required ready time at each terminal of the first set of input terminals based on the evaluation time and the minimum delay value of the terminal; and (5) assigning a ready time at each terminal of the second set of input terminals based on the evaluation time and the maximum delay value of the terminal. That method can further include (1) calculating, for each terminal in the first set of input terminals, a second maximum delay representing a delay between the terminal and each related terminal in the set of output terminals; and (2) assigning an initial ready time to each terminal based on the departure times of the terminal and the related terminal and the maximum delay value. In such a method, the ready time for each terminal of the first set of input terminals can be the greater of the required ready time of the terminal and the initial ready time of the terminal. The method can also insert delay elements between the terminal and the data terminal based on the required ready time of the terminal and the initial ready time of the terminal. To obtain a candidate evaluation time for the state element, the method can add to each terminal the minimum delay value, and then select the maximum value from these results to be the evaluation time.

When an output value of a state element feeds into the timing of another state element, such a relationship requires that the first state element is evaluated after the second state element is evaluated. The method of the present invention can be made to enforce this relationship.

In addition to latches in an emulation model, the present invention is also applicable to flip-flops in an emulation model. In one embodiment, a flip-flop can be converted to a master slave connected latch pair before applying a method of the present invention.

According to another aspect of the present invention, the present invention provides a method for scheduling signal arrivals at a first set of input terminals of a logic module combinationally reaching a write port of a memory element, a second set of input terminals of the logic module combinationally reaching a control input of the memory element, and a set of output terminals of the logic module combinationally reached from a read port of the memory element. Such a method can include (1) computing a minimum delay value between each of the first set of input terminals and the write port; (2) computing a maximum delay value between each of the second set of input terminals and the control input; (3) assigning a ready time for the write port; (4) assigning a required ready time at each terminal of the first set of input terminals based on the ready time of the write port and the minimum delay value of the terminal; and (5) assigning a ready time at each terminal of the second set of input terminals based on the ready time of the write port and the maximum delay value of the terminal. In addition, for a memory element accessed from multiple domains, the method can include modelling the memory element as a collection of single domain read ports and one or more single domain write port. That method can further include (1) calculating a read access time for each of the single domain read port; and (2) calculating a ready time for each of the single domain read ports, the ready time being based on the latest departure time of departure times of terminals in the set of output terminals and the read access time. The initial read time for each terminal of the first set of input terminal can be determined by (1) calculating a write access time of the write port; and (2) selecting a value based on the latest ready time of the single domain read ports and the write access port. The ready time for each terminal of the first set of input terminals can be further refined by the greater of the required ready time of the terminal and the ready time of the terminal. Delay elements can be inserted between the terminal and the write port based on the required ready time of the terminal and the initial ready time of the terminal.

Correct functional verification of any logic circuit with MTSD nets, latches or memory can be achieved using a combination of the above techniques.

The present invention is better understood upon consideration of the detailed description below and the accompanying drawings.

BRIEF DESCRIPTION OF THE DRAWINGS

FIG. 7 shows a tabulation of Depth and MtsdDepth values for each inter-partition wire shown in FIG. 6.

FIG. 8 shows a partial ordering of the inter-partition wires of FIG. 6 based on their respective MtsdDepths, in accordance with one embodiment of the present invention.

FIG. 9 illustrates a procedure for scheduling route-link $(P_i, P_j)$ under the TIERS method.

To facilitate cross-reference among the figures and to simplify description, like elements in the figures are provided like reference numerals.

DETAILED DESCRIPTION OF THE PREFERRED EMBODIMENTS

The present invention provides a method for correct functional verification of a user circuit with multiple asynchronous clock domains, using an emulation system.

Figure 1:
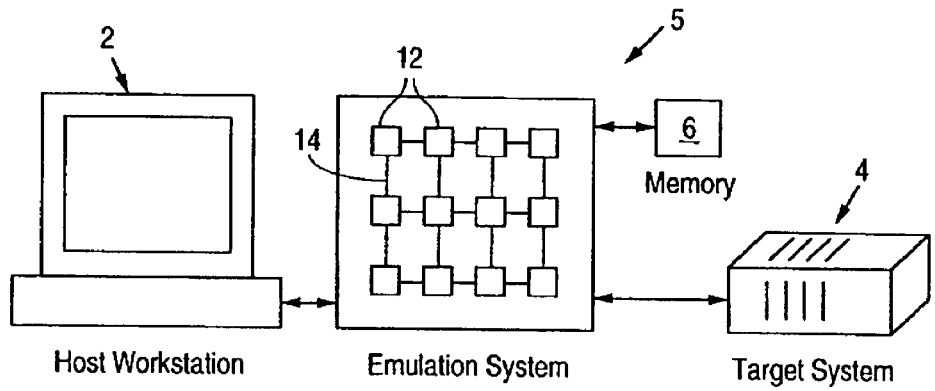
FIG. 1 shows exemplary emulation system 100 for logic verification.
Figure 2:
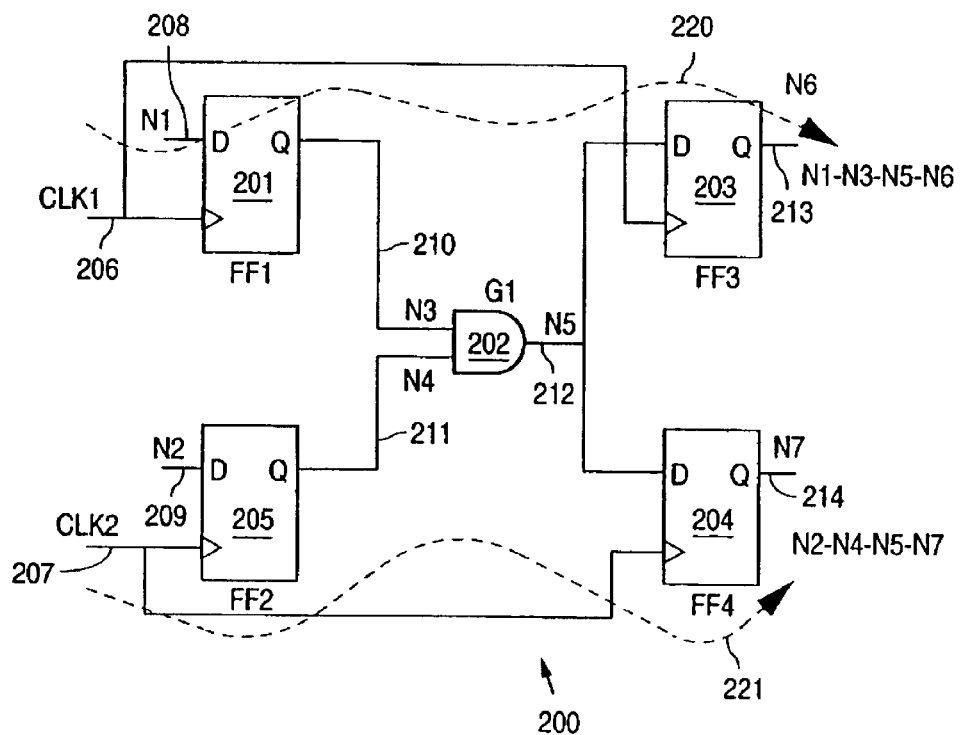
FIG. 2 shows example circuit 200 having example circuit 200 having multiple clock domains.

FIG. 2 shows example circuit 200 having multiple clock domains. As shown in FIG. 2, circuit 200 includes flip-flops ("FFs") 201 and 203, which receive clock signals CLK1 at terminal 206, and FFs 204 and 205, which receive clock signal at terminal 207. Clock signals CLK1 and CLK2 are asynchronous to each other. The data output values of FFs 201 and 205 at terminals 210 and 211 are respectively input values for AND gate 202. The output value of AND gate 202 at terminal 212 is provided to the data input terminals of FFs 203 and 204. Thus, FIG. 2 includes two same-domain paths defined by (1) data input terminal 208 of FF 201, FF 201, data output terminal 210 of FF 201, gate 202, output terminal 212 of Gate 202, data input terminal of FF 203, FF 203 and data output terminal 213 of FF 203, and (2) data input terminal 209 of FF 205, FF 205, data output terminal 211 of FF 205, gate 202, output terminal 212 of gate 202, data input terminal of FF 204, FF 204 and data output terminal 213 of FF 204. In FIG. 2, since the signal at output terminal 212 of gate 202 can transition in response to either one of the signals at terminals 210 and 211, and is sampled by either one of FFs 203 and 204, terminal 212 is known as "multi-transition and sample domain" ("MTSD") net.

By convention, a logic gate driving an MTSD net is known as an MTSD gate. Similarly, a collection of MTSD gates and nets is referred to as MTSD logic.

In an FPGA-based emulation system, if a MTSD net is routed between FPGAs, many timing issues (e.g., such as hold time issues) relating to the MTSD net cannot be fully addressed using conventional techniques, such as those described in the TIERS Scheduler Patent. In the prior art, one attempts to avoid these timing issues by limiting the asynchronous logic to a single FPGA, or by using dedicated pins to transport MTSD values across nets. This approach is not satisfactory because the asynchronous logic can exceed the capacity of a single FPGA, and dedication of pins for transporting MTSD values across nets take up precious pin resources and reduces system performance.

Figure 3:
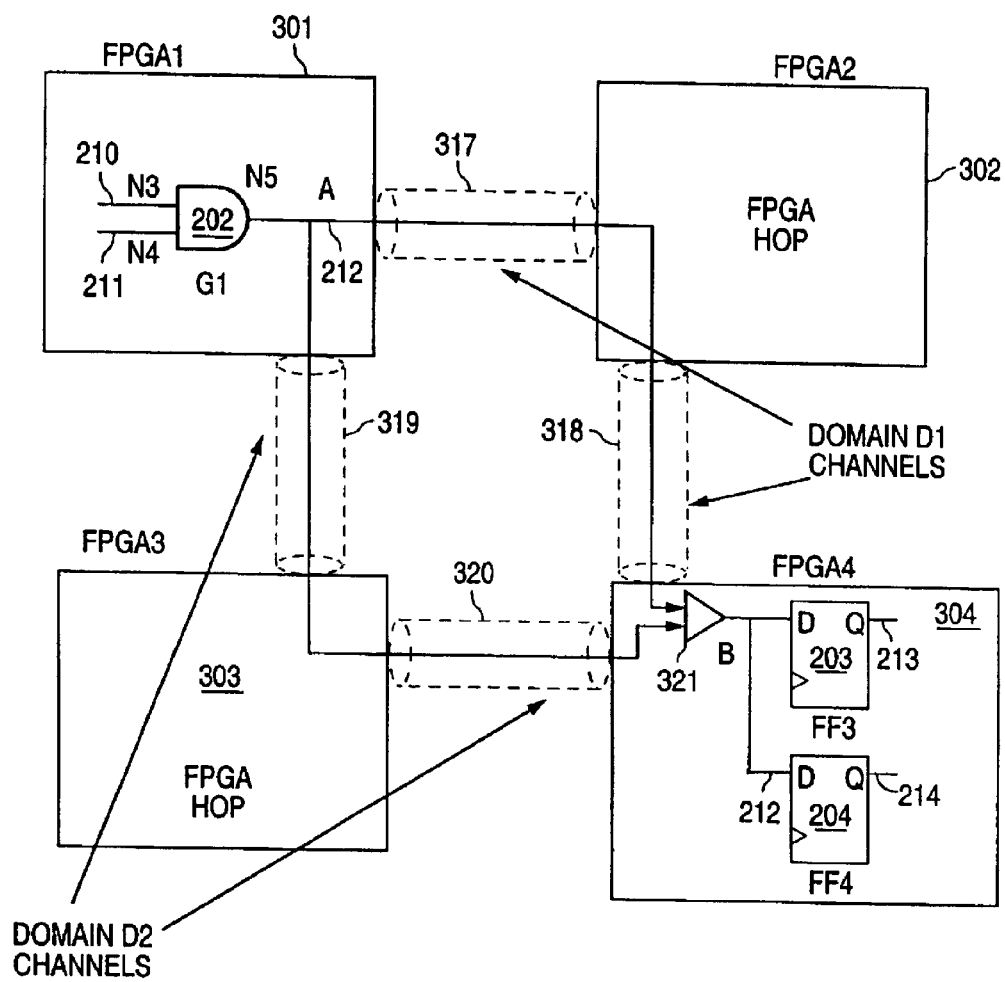
FIG. 3 shows one approach for transporting values of an MTSD net across FPGAs; this approach routes values due to different domains in respective single domain channels.

The inventors observe that, in an MTSD circuit including two or more clock domains, a correct functional model can be achieved by ensuring functional consistency of the MTSD circuit in each domain. From this observation, one approach to transport values of an MTSD net across FPGAs is to split the MTSD net into a number of single domain nets and to route the values due to the different domains to their respective single domain nets, such as the approach shown in FIG. 3. As shown in FIG. 3, circuit 200 of FIG. 2 is partitioned and configured into FPGAs 301–304. (By extension of the convention discussed above, an FPGA partition containing MTSD logic is known as an "MTSD block"). Specifically, the values of the signal at MTSD net 212 are routed from FPGA 301 through single domain channels 317, 318, 319 and 420 to FPGA 304. Channels 317 and 318 transport values due to transitions or events in domain CLK1, and channels 319 and 320 transport values due to transitions or events in domain CLK2. A "merge" element (e.g., a multiplexor) 321 selects the values of MTSD net 212 to provide an output value at the data input terminals to FFs 203 and 204. This approach, however, is insufficient by itself to overcome the timing issues, as illustrated by FIG. 4.

Figure 4:
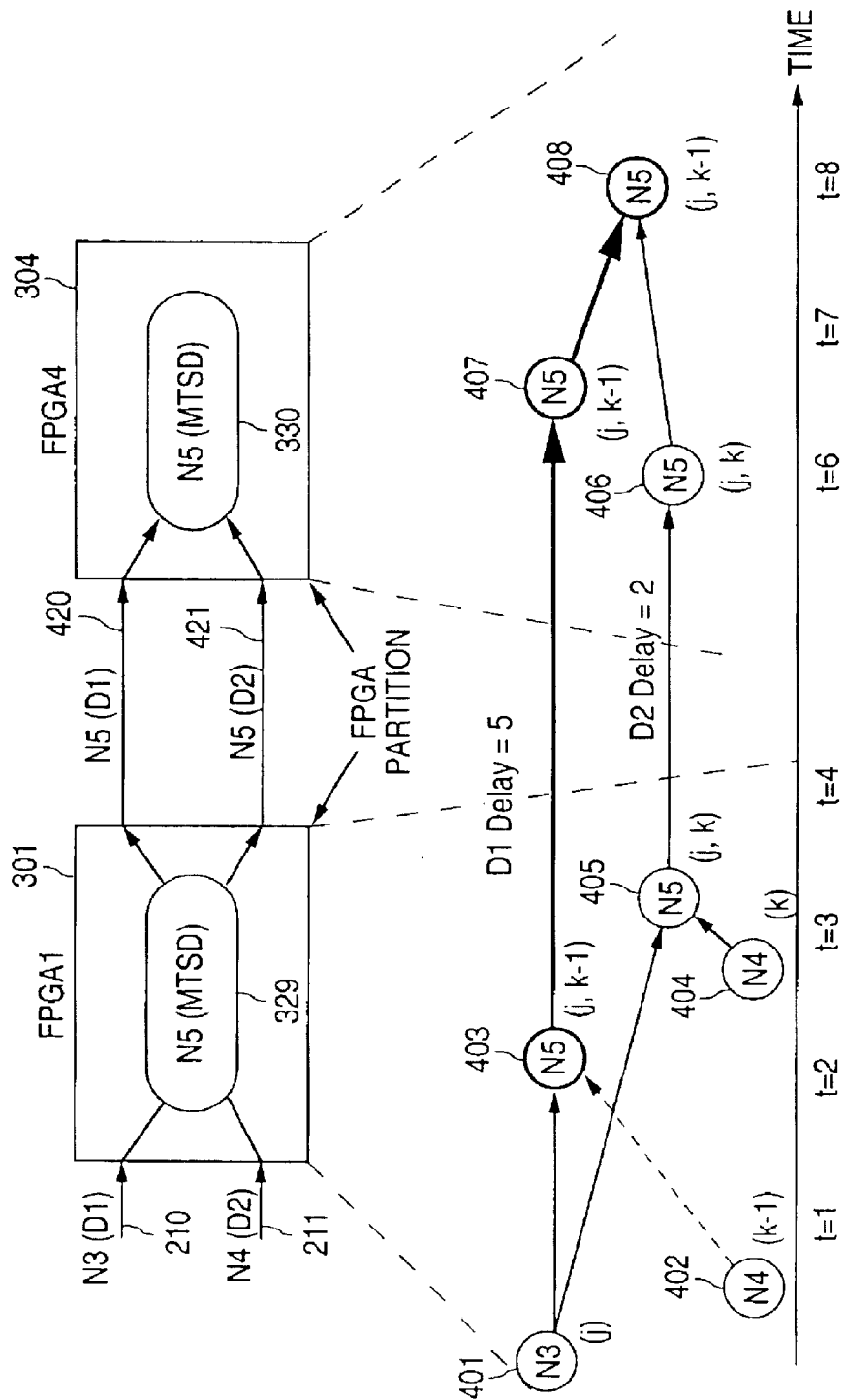
FIG. 4 shows how a logic error that can arise due to routing delays in single domain channels 317–318 and 319 and 320 of FIG. 3.

FIG. 4 shows how a logic error that can arise due to routing delays in the single domain channels 317–318 and 319–320 of FIG. 3. To simplify discussion, single domain channels 317–318 and 319–320, as well as the intervening FPGAs 302 and 303 are represented by single domain signal paths 420 and 421, respectively. Terminals 210 and 211 are shown as input nets carrying signals into MTSD net 329 (i.e., the portion of MTSD net 212 within FPGA 301). Values of MTSD net 329 are transported by single domain signal paths 420 and 421, each signal path being associated with one of the clock domains. Signal paths 420 and 421 are merged into MTSD net 330 in FPGA 304. (MTSD net 330 is the portion of MTSD net 212 within FPGA 304) Initially (i.e., time t=1), a signal transition 401 at terminal 210 takes place in response to the jth transition of clock signal CLK1. Signal transition 401, together with the signal value at terminal 211 after the (k−1)th transition of clock signal CLK2, results in signal transition 403 at MTSD net 212, occurring at time t=2. Signal transition 403 at MTSD net 212 is transported over signal path 420 to FPGA 304, arriving at MTSD net 330 at time t=7 as event 407, after 5 units of delay. Meanwhile, at time t=3, signal transition 404 occurs at terminal 211 in response to the kth transition of clock signal CLK2 Together with the signal value of terminal 210, signal transition 404 results in signal transition 405 at MTSD net 212, which is transported to FPGA 304 over signal path 421, arriving at MTSD 330 at time t=6 after 2 units of delay. However, because of the difference in delays in signal paths 420 and 421, the value of MTSD net 329 resulting from signal transition 404 arrives at MTSD 330 earlier than the value of MTSD net 329 resulting from signal transition 403. As a result, at time t=8, MTSD net 330 takes on the erroneous non-causal value from the earlier transition 403.

To avoid non-causal behavior resulting from differences in the single domain signal path lengths split from an MTSD net, the values on individual paths arriving at the destination FPGA are merged causally to recreate the MTSD value which was transmitted from the source FPGA. In this manner, the order in which events on the MTSD net occurs at the source FPGA is the same as the order in which the same events on the MTSD net occurs in the destination FPGA. To be causally correct, the merged net takes, among all values on single domain paths arriving at the destination FPGA, the value that most recently departs the source FPGA. As can be seen from FIG. 4, due to differences in path delay in the single domain paths, that value need not be the value that most recently arrived at the destination FPGA.

One method to achieve causal merging at the destination FPGA is to equalize the single domain signal path lengths and to synthesize merge logic that ensures that the signal value that arrives most recently at the destination FPGA is selected as the final merged value for the purpose of further evaluation. If multiple signal values arrive at the destination FPGA substantially simultaneously, the merge logic may arbitrarily select one of the values, since the equalized path lengths ensure that those values are identical.

Figure 5:
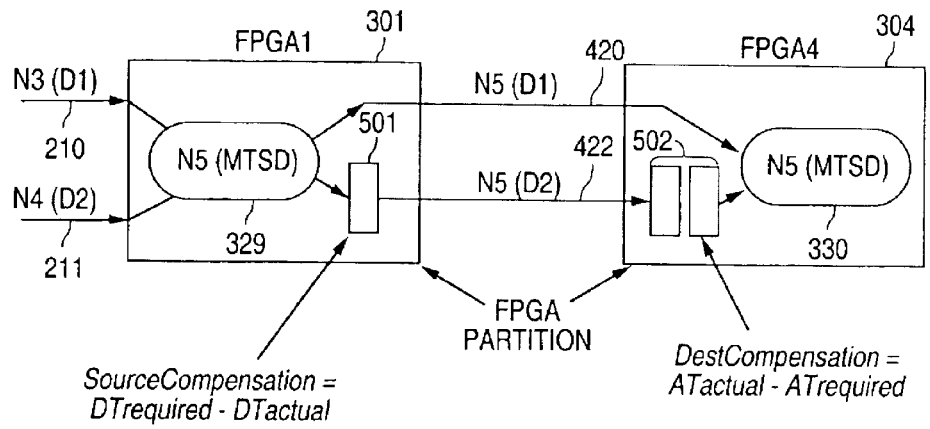
FIG. 5 illustrates compensating single domain signal paths to preserve causality, in accordance with one embodiment of the present invention.

One method for path length equalization is to insert delay elements (e.g., flip-flops) to compensate shorter single domain paths. As illustrated in FIG. 5 and discussed below, single domain signal path 421 (the shorter of signal paths 420 and 421) is replaced by signal path 422, which can achieve the required compensation through inserting delay elements in the source FPGA (e.g., delay elements 501), in the destination FPGA (e.g., delay elements 502), or both. To support static scheduling that preserves causality, a dependency analysis that provides support for MTSD nets is carried out. In one embodiment of the present invention described below, a "reverse" scheduling algorithm one that find paths from the primary output terminals towards the primary input terminals—is used to schedule transporting signals across FPGAs. However, as will be apparent, the same techniques are equally applicable to a forward scheduling algorithm.

Figure 6:
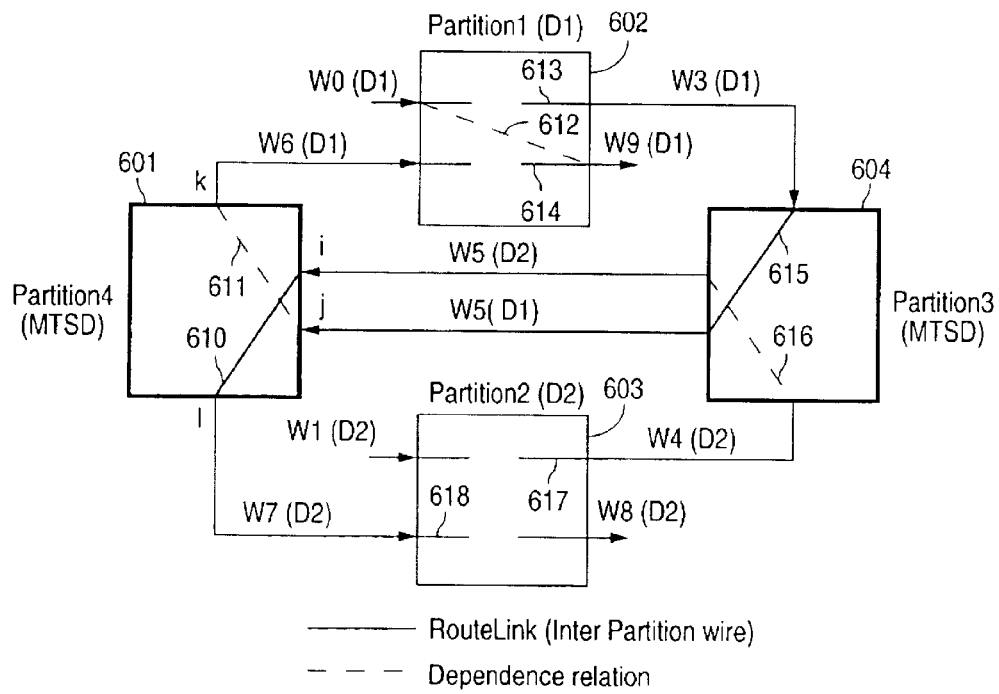
FIG. 6 illustrates a dependency analysis that support MTSD nets, in accordance with the present invention.

FIG. 6 illustrates a dependency analysis that supports MTSD nets, in accordance with the present invention. In this dependency analysis, to support MTSD nets, two types of dependencies are tracked: same-domain dependencies and cross-domain dependencies ("MTSD dependencies"). For same-domain dependencies, data structures Parent(i) and Child(i) are maintained for each block output terminal and each block input terminal, respectively. Parent(i) includes all block input terminals in the same domain that reach block output terminal i combinationally. Similarly, Child(i) includes all block output terminals in the same domain that are reachable from block input terminal i combinationally. For MTSD dependencies, data structures MtsdParent(i) and MtsdChild(i) are maintained for each block output terminal and each block input terminal, respectively. MtsdParent(i) includes all block input terminals that reach block output terminal i combinationally. Similarly, MtsdChild (i) includes all block output terminals that are reachable from block input terminal i combinationally.

FIG. 6 shows circuit blocks or partitions 601–604, including single domain partitions 602 and 603 and multi-domain partitions 601 and 604. Partitions 602 and 603 relate to clock domains D1 and D2, respectively. Partitions 601–604 are interconnected by inter-partition wires W0(D1), W1(D2), W3, W4, W5(D1), W5(D2), W6(D1), W7(D2), W8(D2) and W9(D1), with each wire being associated with the specific clock domain indicated within the parenthesis. An inter-partition wire ($P_i$, $P_j$), also known as a "route-link", is a logical connection from a block output terminal (i.e., output terminals of an FPGA) $P_i$ to a block input terminal $P_j$ of another FPGA. In FIG. 6, the dashed lines within each partition indicate dependency relationships. Specifically, dependencies 612–613 and dependencies 617 and 618 are same domain dependencies of clock domains D1 and D2, respectively. In addition, dependencies 610 and 611 within partition 601 and dependencies 615 and 616 are examples of cross-domain dependencies. Thus, referring to FIG. 6, Child (i)={l}, Parent(l)={i}, MtsdChild(i) {k,l} and MtsdParent (l)={i,j}.

Beginning from a primary output terminal and traversing the dependency relationships, a depth and a MtsdDepth are calculated for each inter-partition wire. The values Depth and MtsdDepth are recursively defined as:

$$\text{Depth (i)} = \begin{cases} 0, & \text{if Child (i) = 0} \\ 1 + \max_{j \in \text{Child (i)}} (\text{Depth (j)}) & \text{otherwise} \end{cases}$$

$$\text{MtsdDepth (i)} = \begin{cases} 0, & \text{if MtsdChild (i) =} \\ 1 + \max_{j \in \text{MtsdChild (i)}} (\text{MtsdDepth (j)}) & \text{otherwise} \end{cases}$$

Assuming Depth(W8)=MtsdDepth(W8)=4 and Depth (W9)=MtsdDepth(W9)=1, due to downstream circuits not shown in FIG. 6, the result of the calculations of Depth and Mtsdepth are tabulated in FIG. 7. Note that inter-partition wires W5(D1) and W5(D2) have different Depth values but the same MstdDepth value. FIG. 8 shows a partial ordering of the inter-partition wires based on their respective Mtsd-Depths.

After the dependency analysis and depth calculations are completed, the partitions can be placed into FPGAs and routed. The route assigned to an inter-partition wire, or route-link, often includes one or more intervening FPGAs between the source and destination FPGAs. Based on this partial ordering, the scheduler schedules a route-link after all the child route-links on which the route-link depends are scheduled. While same domain route-links can be processed independently, related route-links created from an MTSD net are grouped together and processed together. The set of route-links related to an MTSD net n is referenced in this detailed description as MtsdLinks(n).

FIG. 9 illustrates exemplary procedure 900 for scheduling single domain route-link ($P_i$, $P_j$), according to the teachings of the TIERS Scheduling Patent. The present invention extends procedure 900 to handle multi-domain paths. Procedure 900 is applied to route-links one at a time according to the partial order and dependency relationship established in the dependency analysis and depth calculations. As shown in FIG. 9, at step 901, for route-link ($P_i$, $P_j$), the Ready time at block input terminal $P_j$ is calculated. The Ready time is the latest time at which a value must arrive at block input terminal $P_j$. For block input terminal $P_j$ that terminates either at a primary output terminal or a state element k, Ready Time is the delay between $P_j$ to k (written as Delay($P_j$, k)). Then, at step 902, a shortest path sp is then found between block output terminal $P_i$ and block input terminal $P_j$ using, for example, a modified Dijkstra's algorithm, such as that described in *Introduction to Algorithms*, by Coleman et al., published by MIT Press, 1992. The propagation time through path sp is given by a path length estimate PathLength(sp). At step 903, wiring resources along path sp are reserved. At step 904, a Departure time is calculated at block output terminal $P_i$, the Departure time is given by:

Departure time($P_j$)=Ready($P_i$)+PathLength($sp$)

At step 905, update the Ready time of each block input terminal $P_k$ that reaches block output terminal $P_i$ (i.e., for each block input terminal in Parent($P_i$)). The Ready time of $P_k$ is given by Ready time($P_k$)=Departure time($P_i$)+Delay ($P_k$, $P_i$).

For an MTSD net n, as mentioned above, all route-links in MtsdLinks(n) are processed together, as the schedule of one route-link affects the schedule of another route-link within the MtsdLinks. The goal of processing the related route-links of MtsdLinks together is to provide path lengths requiring equal number of virtual clock cycles. That path length ("target distance") is typically at least the length of the longest single domain route-link within that MtsdLinks.

In this embodiment, to process MtsdLinks, the values, for each route-link in the MtsdLinks, DTrequired and DTactual are calculated for the block output terminal of the route-link, and the values ATrequired and ATactual are calculated for the block input terminal of the route-link. DTrequired is the latest time the signal at the block output terminal is required to depart to satisfy the target distance requirement. DTactual is the time at which the signal at the block output terminal is scheduled to depart. ATrequired is the time at which a signal at the block input terminal is required to arrive (i.e., the block input terminal's Ready time). ATactual is the time at which the signal at the block input terminal is scheduled to arrive.

Figure 10:
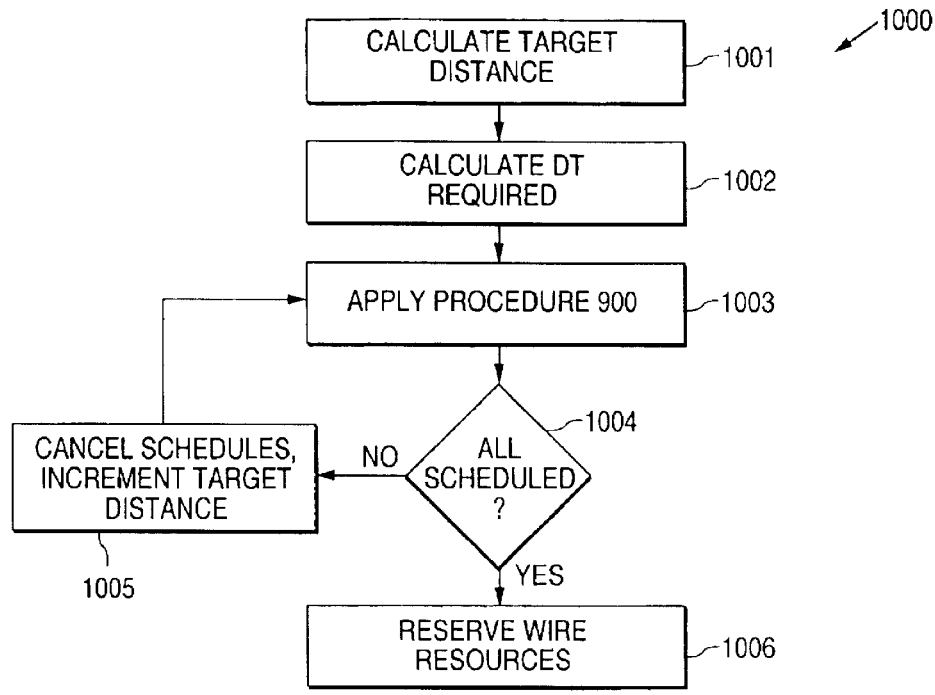
FIG. 10 shows a procedure for processing route-links within an MtsdLink.

The steps taken in one embodiment of the present invention is illustrated by procedure 1000 of FIG. 10. As shown in FIG. 10, at step 1001, after estimating a path length Distance(Ri) for each single domain route-link Ri in the MtsdLinks(n), the target distance for the MtsdLink is given by:

Target Distance=max(min(Distance($R_i$))) for all $R_i$ within MtsdLinks($n$)

At step 1002, for the block output terminal in each route-link of the MtsdLinks, the Dtrequired value is calculated. DTrequired is given by:

DTrequired=ATrequired+Target Distance

At step 1003, for each route-link in the MtsdLink, the procedure of FIG. 9 is applied, such that the route-link meets the ATrequired requirement, while having a length less than or equal to Target Distance.

At step 1004, if all route-links of the MtsdLinks are successfully scheduled at step 1003, no further processing is required, and the procedure goes to step 1006, where the wiring resources are reserved.

At step 1005, i.e., if not all route-links of the MtsdLinks are successfully scheduled at step 1003, all schedules established at step 1003 are canceled. The value of Target Distance is increased by 1, and the procedure returns to step 1003.

After all route-links of the MtsdLinks are successfully scheduled, the paths of the route-links in the MtsdLinks are then equalized, so that the number of virtual clocks in each path is the same. As mentioned above, delay compensation can be achieved in the source FPGA, in the destination FPGA, or both. For each route-link in MtsdLinks, to implement compensation in the source FPGA, the number of unit delay elements (e.g., flip-flops clocked by the virtual clock) required is given by:

Compensation=DTrequired−Dtactual

Alternatively, to implement compensation in the destination FPGA, the number of unit delay elements required is given by:

Compensation=ATactual−ATrequired

Figure 11:
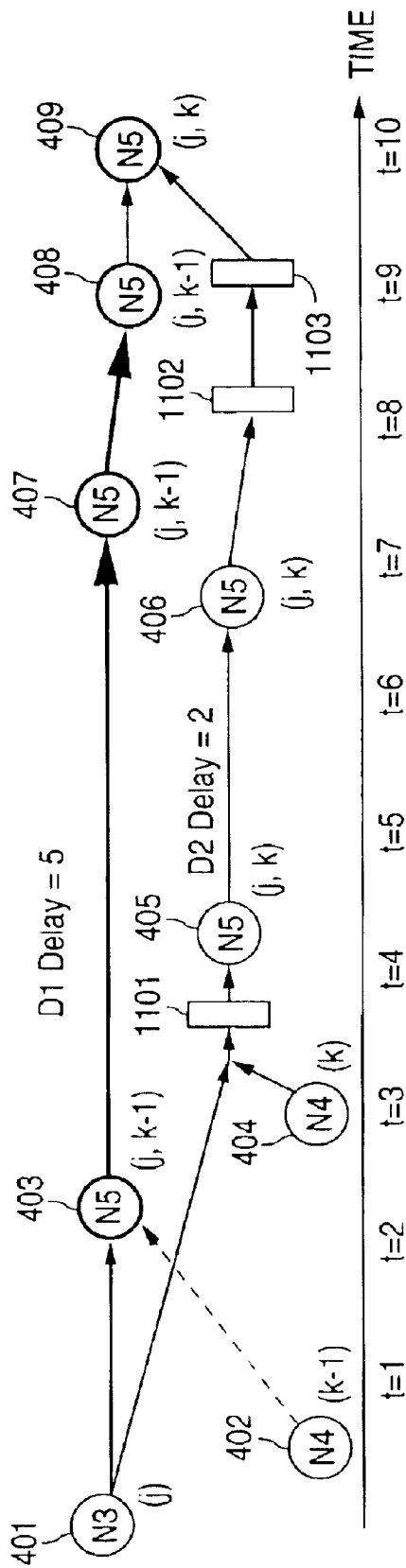
FIG. 11, shows three unit delay elements 1101–1103 inserted in a route-link to preserve causality in the example of FIG. 4.

Of course, the required number of unit delay elements can be allocated between the source and destination FPGAs to implement compensation in both FPGAs. FIG. 11, shows three unit delay elements 1101–1103 inserted into a route-link to preserve causality in the example of FIG. 4.

The present invention also provides for correct emulation of state elements. Specifically, correct emulation of state elements requires that data signals arrive at the state element a "setup" time prior to the clocking or "trigger" signal, and are held for a "hold" time thereafter. For a latch receiving a multi-domain data signal D($A_i$, $B_k$) and clocked or triggered at a gate terminal by multi-domain signal G($A_j$, $B_k$) (i.e., an MTSD latch that responds to transitions in clock domains A and B), at the kth transition of clock signal B, correct operation occurs when the values of data and clock signals are those provided in responsive to the same transition in clock domain A (i.e., i=j, or satisfaction of both hold and setup time requirements). However, the inventors observe that instantaneous setup time violations (i.e., i<j) are correctable, but hold time violations (i.e., j<i) are not. This is because, while the gate is open, a late-arriving data signal provides the correct output value. However, an early arriving data signal clobbers the previous data value before the gate of the latch is closed to latch the former value. This relationship is valid for any arbitrary number of domains. Consequently, to satisfy hold time requirement at each latch, the gate signal of a latch is scheduled to arrive prior to the data signal of the latch. The output value of the latch is evaluated after the arrival of the data signal. In the case of an MTSD latch, these arrival and evaluation order relationships are satisfied in each clock domain.

To provide properly scheduled evaluation of an MTSD latch, all block input terminals having signals affecting transitions at the MTSD latch's data input terminal are identified as a "D-input set", all block input terminals having signals affecting transitions at the MTSD latch's gate input terminal are identified as a "G-input set," and all block output terminals having signals affected by transitions at the terminals in the "D-input set" are identified as a "D-output set". Correct emulation requires that the Ready times of block input terminals in the D-input set and the G-input set, the Ready time of the latch, and the Departure times of the block output terminals in the D-output set be properly calculated for scheduling purpose. Further, for each block input terminal i in D-input set and G-input set, the values MinDelay(i, L) and MaxDelay(i, L), respectively the minimum and maximum delays in combinational circuits between block input terminal i and the corresponding data or gate terminal at the MTSD latch L, are calculated in this embodiment.

Because each block input terminal can combinationally reach more than one latch, an evaluation order between latches is analyzed for each MTSD partition. Specifically, where a block input terminal reaches combinationally to data terminals of more than one latch ("DD relationship"), their respective D-input sets and D-output sets are combined. If a block input terminal combinationally reaches a data input of latch L1 and a gate input of latch L2 ("DG relationship"), then evaluation of latch L2 occurs before evaluation of latch L1. To provide this evaluation order, a data structure DGchild(L2) provides a list of latches that are evaluated after latch L2. If a cyclical DG relationship involving two or more latches exists ("DG-cycle relationship"), the D-input sets and the D-output sets of these latches are evaluated together, as in latches within a DD relationship.

Figure 12:
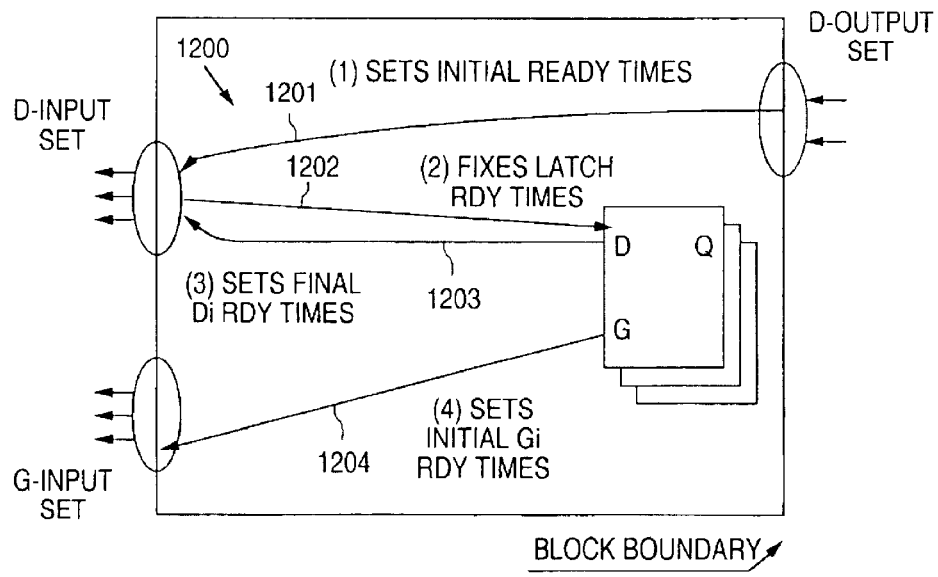
FIG. 12 shows procedure 1200 for calculating the Ready times of block input terminals in the D-input set and C-input set of a latch or group of latches, in accordance with one embodiment of the present invention.

The Ready times of block input terminals in the D-input set and G-input set of a latch or group of latches (i.e., latches in DD relationship or DG-cycle relationship) are calculated using the procedure 1200 illustrated by FIG. 12. As shown in FIG. 12, at step 1201, each block input terminal $D_i$ in an D-input set is provided an initial Ready time($D_i$) based on the Departure time of each block output terminal $O_j$ in the latch's D-output set. The initial Ready time($D_i$) is given by:

Ready time($D_i$)=max(Departure time($O_j$)+MaxDelay($D_i$, $O_j$))

At step 1202, the Ready time(L) of the latch is updated to ensure the evaluation time of the latch allows for propagation of the signals at the block input terminals to the latch. Thus, Ready time(L) is given by:

Ready time($L$)=max(Ready time($D_i$)−MinDelay($D_i$, $L$))

Then, because the latch must be evaluated previous to each latch $L_C$ with which it has a DG realationship, Ready time(L) is updated to reflect this dependency relationship. Thus, Ready time($L$)=max(Ready time($L$), Ready time($L_C$))

At step 1203, a value RequiredReadyTime($D_i$) is calculated. RequiredReadyTime($D_i$) ensures that data does not arrive sooner than the signal at the gate terminal:

RequiredReadyTime($D_i$)=Ready time($L$)+MinDelay($D_i$, $L$)

If the ReguiredReadyTime($D_i$) is greater than the corresponding Ready time($D_i$), Ready time($D_i$) is updated:

Ready time($D_i$)=max(Ready time($D_i$), RequiredReadyTime($D_i$))

If Ready time($D_i$) is greater than RequiredReadyTime ($D_i$), a delay compensation is provided by inserting unit delay elements between block input terminal $D_i$ and latch L. The delay compensation is given by:

Delay compensation($D_i$, $L$)=Ready time($D_i$)−RequiredReadyTime($D_i$)

At step 1204, value ReadyTime(L) the latch provides an initial value for Ready time($G_i$) to each block input terminal of G-input set of the latch:

Ready time($G_i$)=max(Ready time($G_i$), Ready time($L$))+MaxDelay($G_i$, $L$)

This initial value Ready time($G_i$) is updated by other terminals combinationally reached from block input terminal $G_i$. Procedure 1200 ensures that Ready time($G_i$) is less than or equal to Ready time($D_i$), where $D_i$ and $G_i$ are block input terminals of the same latch's D-input set and G-input set, respectively.

Although the above discussion relates to latches, emulation of MTSD flip-flops can be achieved by replacing each MTSD flip-flop by a master slave latchpair, and then processing the resulting circuit according to procedure 1200 discussed above.

Figure 13:
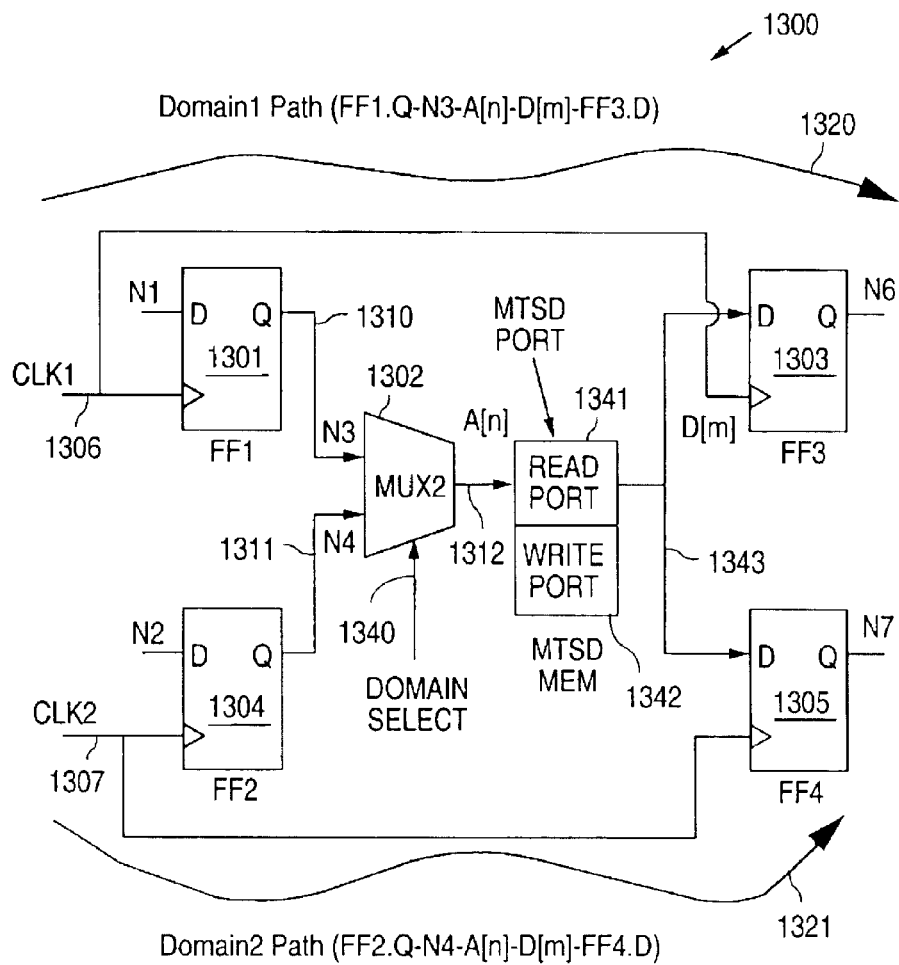
FIG. 13 shows example memory circuit 1300 having read and write ports accessed from multiple clock domains.

The present invention also provides for correct emulation of memory elements. FIG. 13 shows example memory circuit 1300 having read and write ports accessible from multiple clock domains. In the embodiment of the present invention described below, although a multi-ported memory is used for illustration purpose, the present invention is applicable also to a single-ported memory. As shown in FIG. 13, circuit 1300 includes flip-flops ("FFs") 1301 and 1303, which receive clock signals CLK1 at terminal 1306, and FFs 1304 and 1305, which receive clock signal at terminals 1307. Clock signals CLK1 and CLK2 are asynchronous to each other. The data output values of FFs 1301 and 1305 at terminals 1310 and 1311 are respectively input values for multiplexor 1302, which output value is selected by a domain selection signal at terminal 1340. The output value of multiplexor 1302 at terminal 1312 is provided to an address input terminal of read and write ports 1341 and 1342. Read port 1341 provides one or more data output terminal 1343, which value is latched into FFs 1303 and 1304. Thus, FIG. 13 includes two same-domain paths defined by (1) data output terminal 1310 of FF 1301, multiplexor 1302, output terminal 1312 of multiplexor 1302, address input terminal of read 1341, output terminal 1343 of read port 1341, and data input terminal of FF 1303, and (2) data output terminal 1311 of FF 1304, multiplexor 1302, output terminal 1312 of multiplexor 1302, address input terminal of read port 1341, output terminal 1343 of read port 1341, and data input terminal of FF 1305.

Figure 14:
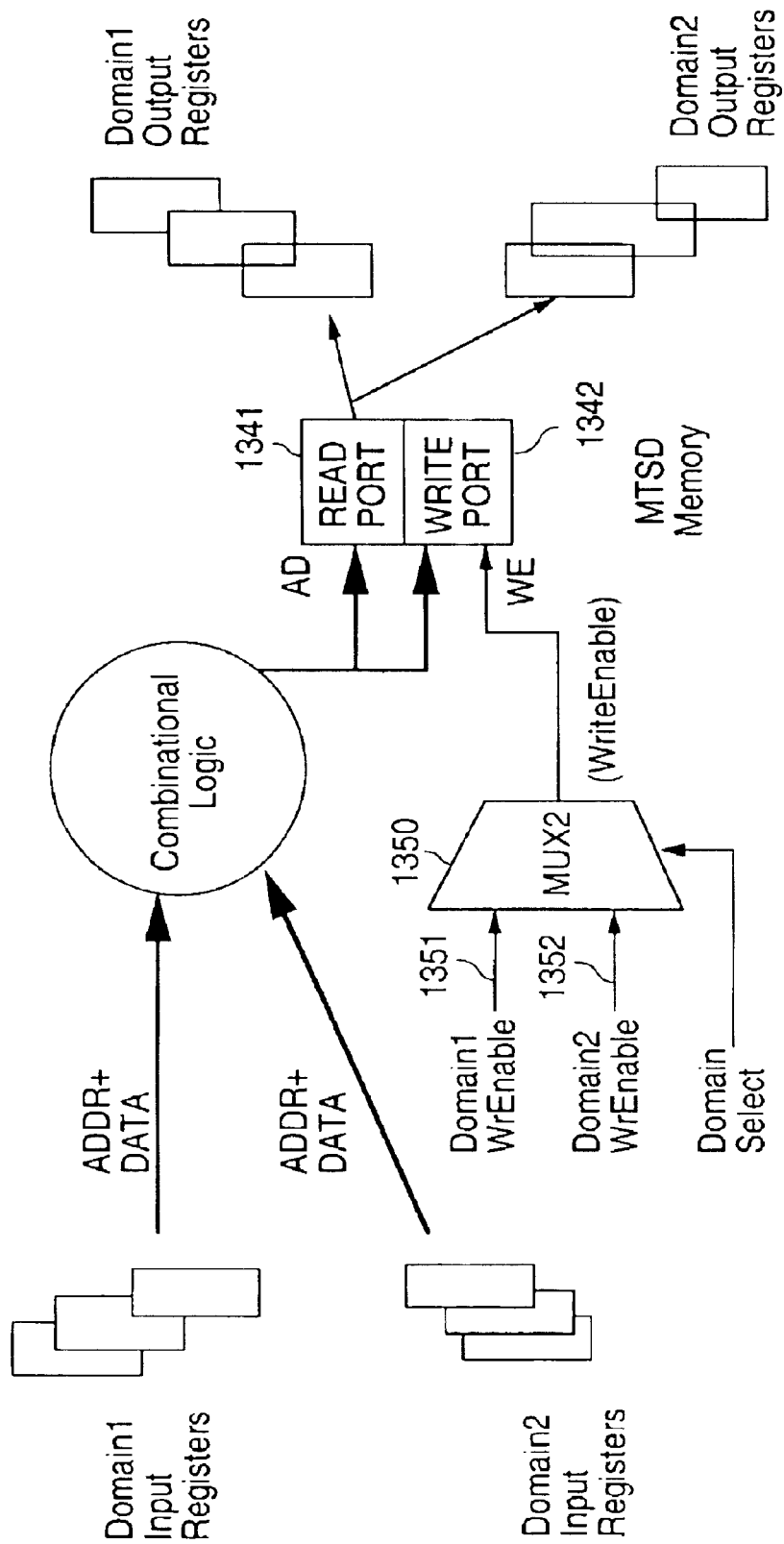
FIG. 14 is a slightly more general example of an MTSD memory.

In FIG. 13, although the signal at output terminal 1312 of multiplexor 1302 can transition in response to either signals at terminals 1310 and 1311, read port 1341 and write port 1342 is accessed at any given time from a single domain. Over time, however, read and write ports 1341 and 1342 are accessed by multiple clock domains. The output signal 1343 is sampled by either one of FFs 1303 and 1304 of clock domains CLK1 and CLK2, respectively. FIG. 14 is a slightly more general example of an MTSD memory. In FIG. 14, multiplexor 1350 selects a write enable signal for write port 1342 from write enable signals 1351 and 1352 from two or more clock domains. In this description, a read port is referred to as an "MTSD read port" if its address lines are driven by MTSD nets, and its data output terminals are sampled in two or more clock domains. In this description, a write port is referred to as an "MTSD write port" if its write enable signal or an address bit is driven by an MTSD net. A memory having an MTSD read or write port is referred to herein as an MTSD memory.

In the logic circuit described herein, the total delay between two sequential elements (i.e., the propagation delay through combinational logic, interconnect delay and setup time) is less than one period of the clock signal clocking the sequential elements. In an MTSD circuit, this delay requirement is satisfied in each clock domain. In the context of a memory, this requirement means that an address bit is propagated from an address register to an address terminal of a read port, a read access is performed and the output data from the read access is provided to an output register all in one user clock cycle.

In a multi-port memory, a read access typically provides the value of the most recent write ("transparent memory"). To achieve this result, a write access is rig processed before a read access. In an MTSD memory, this requirement means that a write port access, a read port access, and address and data communication are carried out within one cycle of each clock domain irrespective of any other clock domain.

The inventors observe that, as in a latch, instantaneous setup time violations in an MTSD memory are correctable, whereas instantaneous hold time violations result in an erroneous operation. In this context, for an MTSD memory receiving a multi-domain data signal D($A_i$, $B_k$) in response to multi-domain address or write enable signal AW($A_j$, $B_k$) (i.e., an MTSD memory responsive to transitions in clock domains A and B), at the kth transition of clock signal B, correct operation occurs when the values of data and address or write enable signals are those provided in response to the same transition in clock domain A (i.e., i=j, or satisfaction of both hold and setup time requirements). However, the inventors observe that instantaneous setup time violations (i.e., i<j) are correctable, but hold time violations (i.e., j<i) are not. This is because, while the address or write enable signal is active, a late-arriving data signal provides the correct output value. However, an early arriving data signal clobbers the previous data value before the address or write enable signal becomes active to latch the former value. This relationship is valid for any arbitrary number of domains. Consequently, to satisfy hold time requirement at each MTSD memory, the address or write enable signal of a memory is scheduled to arrive prior to the data signal of the memory. The output value of the memory is evaluated after the arrival of the data signal. In the case of an MTSD memory, these arrival and evaluation order relationships are satisfied in each clock domain.

Figure 15:
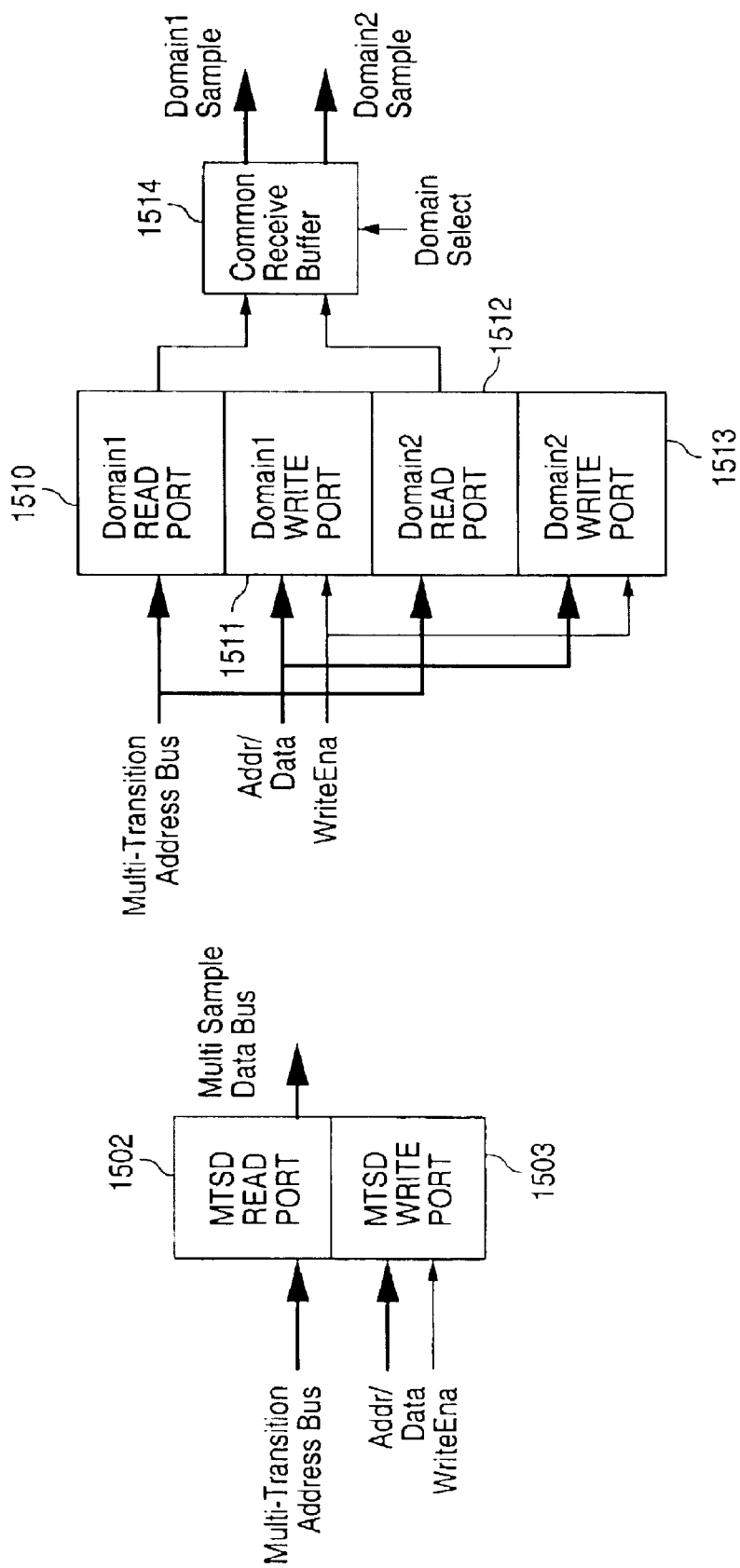
FIG. 15 illustrates the transformation MTSD read and write ports 1501 and 1502 into single domain read and write ports 1510, 1511, 1512 and 1513, respectively.

Transparent MTSD memories can be achieved in an emulation system by conceptually splitting, for scheduling purpose, read or write MTSD ports into single domain ports and tracking the dependency of the read and write ports in each clock domain. FIG. 15 illustrates the transformation MTSD read and write ports 1501 and 1502 into single domain read and write ports 1510, 1511, 1512 and 1513, respectively. The output data signals from the single domain ports are received into common receive buffer 1514 to ensure that a consistent image of read data that can be sampled from both clock domains CLK1 and CLK2.

Figure 16:
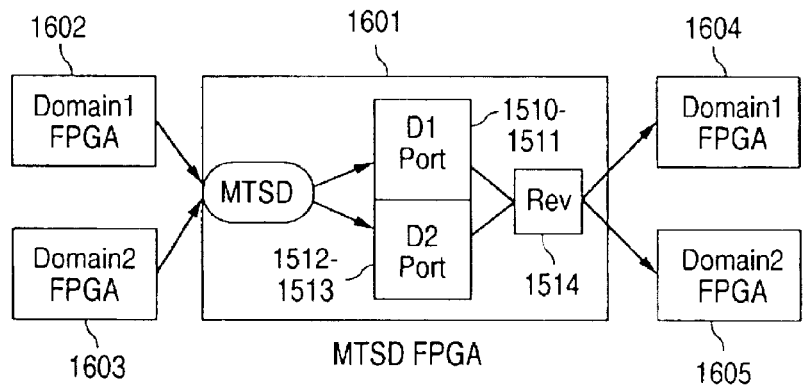
FIG. 16 shows single domain ports 1510 and 1511 provided in an MTSD block within an MTSD FPGA 1601 interact with single domain FPGAs 1602 and 1603 driving input data into the MTSD FPGA and with single domain ports 1604 and 1605 sampling output data from the MTSD FPGA.
Figure 17:
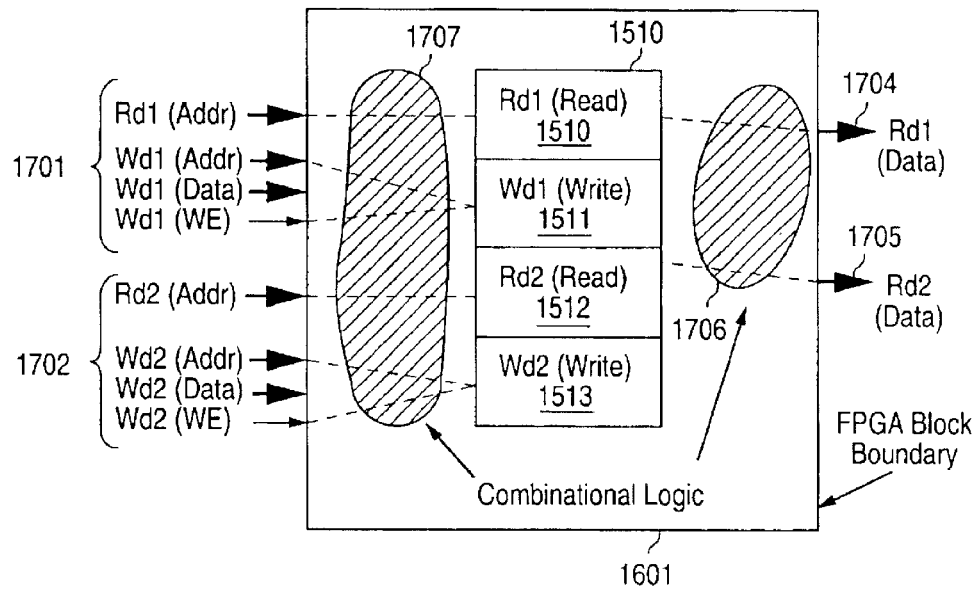
FIG. 17 shows in further detail the memory partition in FPGA 1601.

In one embodiment, as illustrated by FIG. 16, single domain ports 1510–1511 (read and write) and 1512–1513 (read and write) in an MTSD block within an MTSD FPGA 1601 interact with single domain FPGAs 1602 and 1603 driving input data into the MTSD FPGA, and with single domain ports 1604 and 1605 sampling output data from the MTSD FPGA. Common receiver buffer 1514 provides a consistent image of read data that can be sampled from both domains. FIG. 17 shows in further detail the conceptual organization of memory ports in the partition of FPGA 1601. As shown in FIG. 17, FPGA 1601 receives from single domain FPGA 1602 single domain memory access signals 1701, including read address signals, write address and data signals, and a write enable signal. Similarly, FPGA 1601 receives from single domain FPGA 1603 single domain memory access signals 1702, including read address signals, write address and data signals, and a write enable signal. Single domain signals 1701 and 1702 reach memory ports 1510–1513 through combinational circuit 1707. Read output data are provided as single domain read data output signals 1704 and single domain read data output signals 1705.

Port-splitting for the purpose of scheduling increases the number of accesses to memory, but does not increase either the capacity requirements of the memory or the total number of ports in the physical implementation. Thus, the additional cost taxes only on performance and not capacity. As the memory integrated circuits typically used for emulating user memories in an emulation system are much faster than the FPGAs emulating user logic circuits, additional accesses to memory typically does not materially affect overall performance of the emulation.

To provide properly scheduled evaluation of an MTSD memory, one embodiment of the present invention creates schedules by taking up single domain write ports one by one. Accordingly, all block input terminals having signals affecting transitions at a single domain write port of an MTSD memory are identified as a "D-input set". The D-input set includes not only any block input terminal with a signal reaching any of the data input terminals, but also block input terminals with a signal reaching both a data input terminal and either an address input terminal or a write enable input terminal of the MTSD memory. With respect to the same write port, all block input terminals having signals affecting transitions at the MTSD memory's address input terminals or a write enable terminal are identified as a "AW-input set". Similarly, with respect to the write port, all block output terminals having signals affected by transitions at the MTSD memory's data output terminals at a read port dependent upon the write port are identified as a "RD-output set". Correct emulation requires that the Ready times of block input terminals in the D-input set and the AW-input set, the Ready time of each single domain ports, and the Departure times of the block output terminals in the RD-output set be properly calculated for scheduling purpose. Further, for each block input terminal i in D-input set and the AW-input set, the values MinDelay(i, p) and MaxDelay(i, p), respectively the minimum and maximum delays between block input terminal i and the corresponding data or address terminal at an MTSD port p, are calculated in this embodiment. In this embodiment, two types of dependencies are recognized: dependency between terminals of the D-input set and the terminals of the AW-input set, and dependency between write ports and the read ports—including cross domain read ports.

Figure 18:
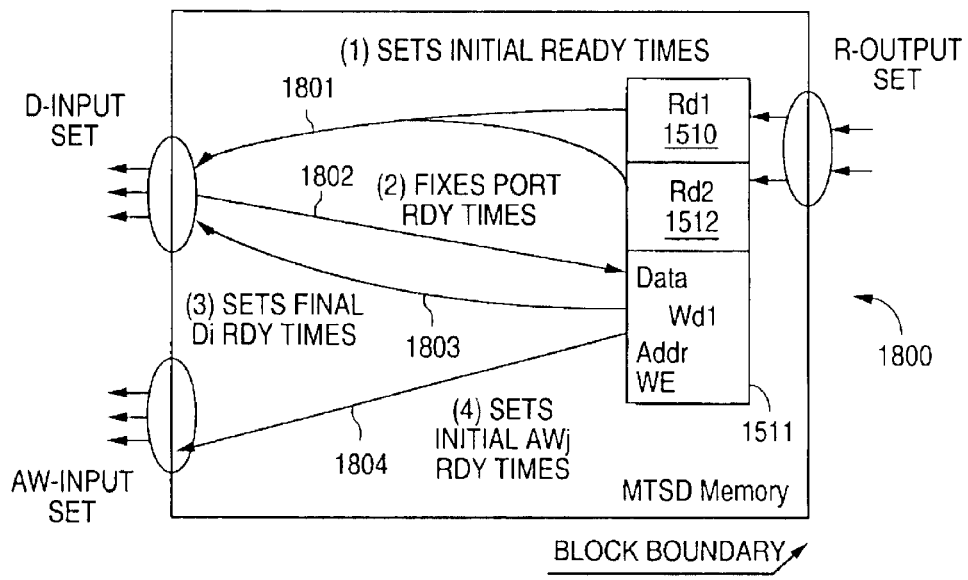
FIG. 18 shows procedure 1800 which provides the Ready times of block input terminals in the D-input set and AW-input set of a write port.

The Ready times of block input terminals in the D-input set and the lower bound of the Ready times of block input terminals of AW-input set of write port 1511 are calculated using procedure 1800 illustrated by FIG. 18. As shown in FIG. 18, at step 1801, each block input terminal $D_i$ in an D-input set is provided an initial Ready time($D_i$) based on the Departure time of each block output terminal $O_j$ in the write port 1511's RD-output set (which includes not only read data output terminals of same domain read port 1510, but also read data output terminals of cross domain read port 1512). First, the Ready time($R_i$) for each dependent read port $R_i$ is given by:

Ready time($R_i$)=max(Departure time($O_j$))+ReadAccess, where ReadAccess is the access time at read port $R_i$.

Then, the initial Ready time($D_i$) of each block input terminal $D_i$ in write port 1511's D-output set is given by:

Ready time($D_i$)=max(Ready time($R_i$))+WriteAccess, where WriteAccess is the write access time of write port 1511.

At step 1802, the Ready time(W) of write port 1511 is updated to ensure the evaluation time of the write port allows for propagation of the signals at the block input terminals to the write port. Thus, Ready time(W) is given by:

Ready time(W)=max(Ready time($D_i$)−MinDelay($D_i$, W))

At step 1803, a value RequiredReadyTime($D_i$) is calculated. RequiredReadyTime($D_i$) ensures that data does not arrive sooner than the signal at the address or write enable terminals:

RequiredReadyTime($D_i$)=max(Ready time($D_i$), (Readytime(W)+MinDelay($D_i$, W)))

Then, procedure 900 of FIG. 9 is applied to the block input terminals of the D-input set of write port 1511 to calculate the final Ready time($D_i$)'s, using the RequiredReadyTime($D_i$) calculated above.

If Ready time($D_i$) is greater than RequiredReadyTime ($D_i$), a delay compensation is provided by inserting unit delay elements between block input terminal $D_i$ and memory write port W. The delay compensation is given by:

Delay compensation($D_i$, W)=Ready time($D_i$)−RequiredReadyTime($D_i$)

At step 1804, value ReadyTime(W) of memory write port W provides an initial value for Ready time($AW_i$) to each block input terminal of AW-input set of write port 1511:

Ready time($AW_i$)=max(Ready time($AW_i$), Ready time(W))+MaxDelay($AW_i$, W)

This initial value Ready time($AW_i$) is updated by other output terminals combinationally reached from block input terminal $AW_i$. Procedure 1800 ensures that Ready time ($AW_i$) is less than or equal to Ready time ($D_i$), where $D_i$ and $AW_i$ are block input terminals of the write port's D-input set and AW-input set, respectively.

Although the above discussion relates to level sensitive MTSD ports, emulation of edge sensitive MTSD ports can be achieved by replacing each MTSD edge sensitive port by a master slave level sensitive memories, and then processing the resulting circuit according to procedure 100 discussed above.

The above detailed description is provided to illustrate the specific embodiments of the present invention and is not intended to be limiting. Numerous variation and modification within the scope of the present invention are possible. For example, in addition to in-circuit emulation, the present invention is also applicable to a targetless emulation, a static target emulation (where the emulation provides one or more clock to the target system), a co-modeling (where the model running in the emulator hardware interacts with software in the host processor), or a combination of some of the above techniques. The present invention is set forth in the following claims.

We claim:

1. A method for transporting, between a source logic module and a destination logic module, values of a signal which has transitions and is sampled in multiple clock domains, comprising:
   dividing said signal into a plurality of related single domain signals;
   assigning said related single domain signals to be routed through separate paths between said source and destination logic modules; and
   causally merging said related single domain signals at said destination logic module.

2. A method as in claim 1, further comprising inserting delay elements in selected ones of said paths such that transit times in said paths are substantially equal.

3. A method as in claim 2, wherein said causal merging comprising, at said destination logic module, selecting as said value of said signal the most recently arrived value among values on said paths.

4. A method as in claim 2, wherein said delay elements are inserted in said source logic module.

5. A method as in claim 2, wherein said delay elements are inserted in said destination logic module.

6. A method as in claim 2, wherein said paths of said related single domain signals are dependently scheduled.

7. A method as in claim 1, further comprising computing a target distance at least the length of the longest one of said separate paths.

8. A method as in claim 7, wherein each of said paths comprises an output terminal of said source logic module and an input terminal of said destination logic module, said method further comprising satisfying a required arrival time requirement of said single domain signal at said input terminal.

9. A method as in claim 8, further comprising scheduling each of said paths having a length less than or equal to said target distance.

10. A method as in claim 8, further comprising creating a relationship that relates said output terminal with a plurality of input terminals of said source logic module, each of said plurality of input terminals being linked to said output terminal via a combinational logic circuit.

11. A method as in claim 10, further comprising computing, for each related single domain paths a same domain depth and a multi-domain depth based on said relationship.

12. A system, comprising:
   a source logic module configured to process values of a signal having transitions and to sample the signal in a plurality of clock domains; and
   a destination logic module coupled to the source logic module,
   said the source logic module being further configured to divide the signal into a plurality of related single domain signals, and to assign said related single domain signals to be routed through separate paths between said source and destination logic modules, and to causally merge said related single domain signals.

13. The system of claim 12, further including a delay element in at least one of said paths, the delay element having a delay such that transit times in said paths are substantially equal.

14. The system of claim 13, wherein said destination module is further configured to select as said value of said signal the most recently arrived value among values on said paths.

15. The system of claim 13, wherein said source logic module includes said delay element.

16. The system of claim 13, wherein said destination logic module includes said delay element.

17. The system of claim 13, wherein said paths of said related single domain signals are dependently scheduled.

18. The system of claim 12, wherein the system is configured to determine a target distance at least the length of the longest one of said separate paths.

19. The system of claim 18, wherein each of said paths comprises an output terminal of said source logic module and an input terminal of said destination logic module, wherein a required arrival time requirement of said single domain signal at said input terminal is satisfied.

20. The system of claim 19, wherein the system is configured to schedule each of said paths having a length less than or equal to said target distance.

21. The system of claim 19, wherein the system is configured to determine a relationship that relates said output terminal with a plurality of input terminals of said source logic module, each of said plurality of input terminals being linked to said output terminal via a combinational logic circuit.

22. The system of claim 21, wherein the system is configured to determine, for each related single domain path, a same domain depth and a multi-domain depth based on said relationship.

* * * * *

UNITED STATES PATENT AND TRADEMARK OFFICE
CERTIFICATE OF CORRECTION

PATENT NO. : 6,817,001 B1
DATED : November 9, 2004
INVENTOR(S) : Muralidhar R. Kudlugi et al.

Page 1 of 1

It is certified that error appears in the above-identified patent and that said Letters Patent is hereby corrected as shown below:

Column 16,
Line 7, please replace "paths" with -- path, --.

Signed and Sealed this

Sixteenth Day of August, 2005

JON W. DUDAS
*Director of the United States Patent and Trademark Office*